(12) United States Patent
Stevens et al.

(10) Patent No.: US 6,465,761 B2
(45) Date of Patent: Oct. 15, 2002

(54) HEAT LAMPS FOR ZONE HEATING

(75) Inventors: Ronald R. Stevens, San Ramon, CA (US); Eric Shero, Phoenix, AZ (US); Ravinder K. Aggarwal, Gilbert, AZ (US); Michael W. Halpin, Scottsdale, AZ (US)

(73) Assignee: ASM America, Inc., Phoenix, AZ (US)

(*) Notice: Subject to any disclaimer, the term of this patent is extended or adjusted under 35 U.S.C. 154(b) by 0 days.

(21) Appl. No.: 09/911,212

(22) Filed: Jul. 23, 2001

(65) Prior Publication Data

US 2002/0007797 A1 Jan. 24, 2002

Related U.S. Application Data

(60) Provisional application No. 60/220,697, filed on Jul. 24, 2000.

(51) Int. Cl.[7] .................................................. F27B 5/14
(52) U.S. Cl. ........................ 219/411; 219/390; 219/405; 118/725; 118/501; 392/411; 392/416
(58) Field of Search ................................ 219/390, 405, 219/411; 392/416, 411, 418; 118/724, 725, 50.1

(56) References Cited

U.S. PATENT DOCUMENTS

| 3,636,398 | A |   | 1/1972  | Boyce |                |
|-----------|---|---|---------|-------|----------------|
| 3,836,751 | A | * | 9/1974  | Anderson | ........ 219/411 |
| 5,010,659 | A |   | 4/1991  | Treleven |              |
| 5,623,149 | A |   | 4/1997  | Kilmer |                |
| 5,740,314 | A |   | 4/1998  | Grimm |                 |
| 6,205,677 | B1|   | 3/2001  | Yune |                  |
| 6,207,936 | B1| * | 3/2001  | de Waard et al. ........... 219/497 |
| 6,284,048 | B1| * | 9/2001  | Van Bilsen et al. ......... 118/666 |
| 6,324,341 | B1| * | 11/2001 | Riley et al. ................. 392/416 |
| 6,369,363 | B2| * | 4/2002  | Hauf et al. ................. 219/411 |
| 6,392,210 | B1| * | 5/2002  | Wu ............................ 392/416 |

FOREIGN PATENT DOCUMENTS

| EP | 0 416 944 A1 | 3/1991 |
| EP | 0 594 183 B1 | 4/1994 |
| EP | 0 594 183 A1 | 4/1994 |
| EP | 0 720 730 B1 | 7/1996 |

* cited by examiner

Primary Examiner—Teresa Walberg
Assistant Examiner—Shawntina T. Fuqua
(74) Attorney, Agent, or Firm—Knobbe, Martens, Olson & Bear, LLP

(57) ABSTRACT

A reactor chamber is positioned between a top array of heat lamps and a bottom array of heat lamps. At least one of the heat lamps forming the top and bottom arrays features a segmented filament such that power output along the length of the heat lamp differs. In one configuration, the heat lamp has a pair of high energy output regions spaced from each other by a lower energy output region. In some configurations, at least one of the heat lamps forming the top and bottom arrays is non-linear, such as U-shaped. In further configurations, a non-linear heat lamp has a segmented filament with segments or areas of different winding density.

44 Claims, 12 Drawing Sheets

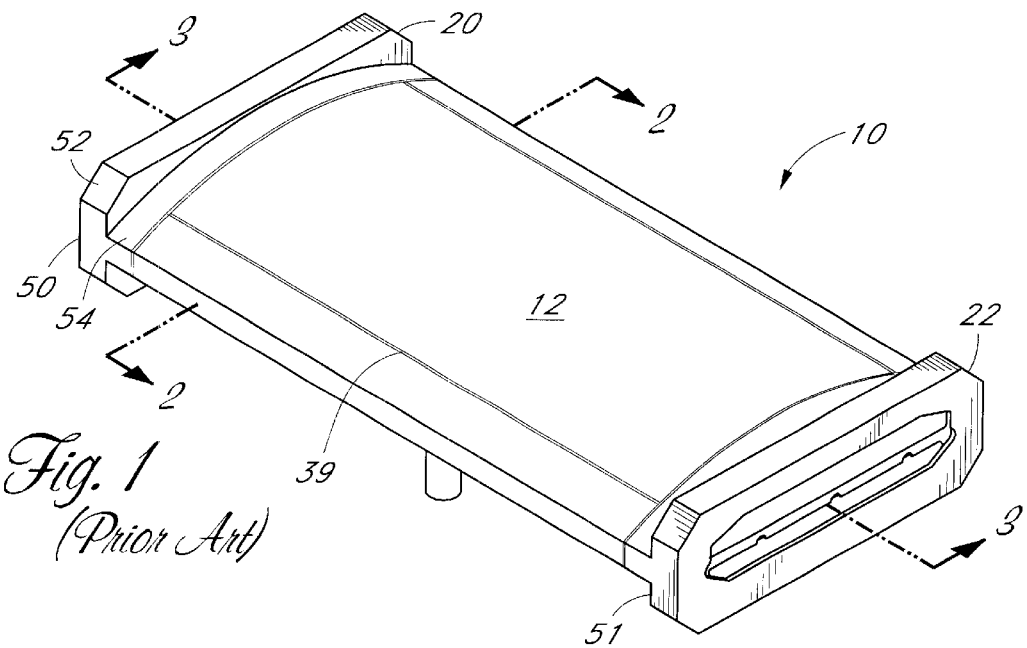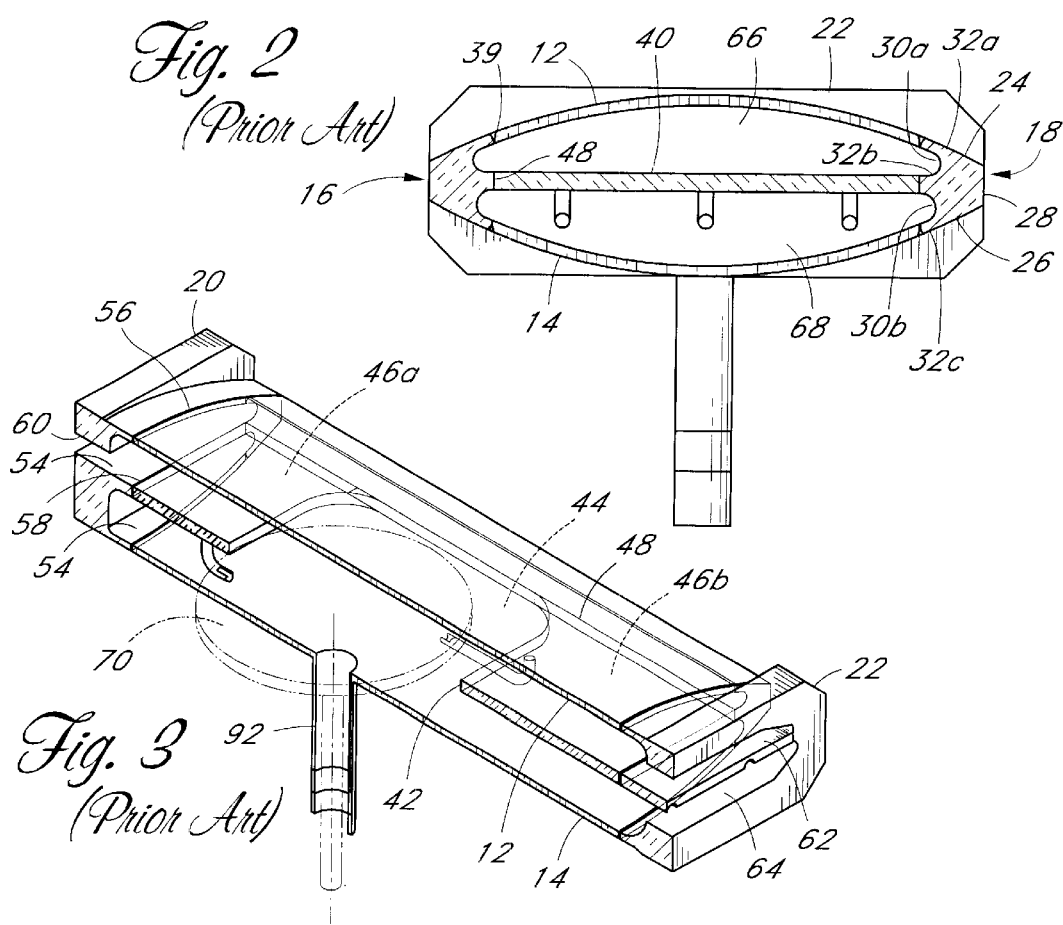

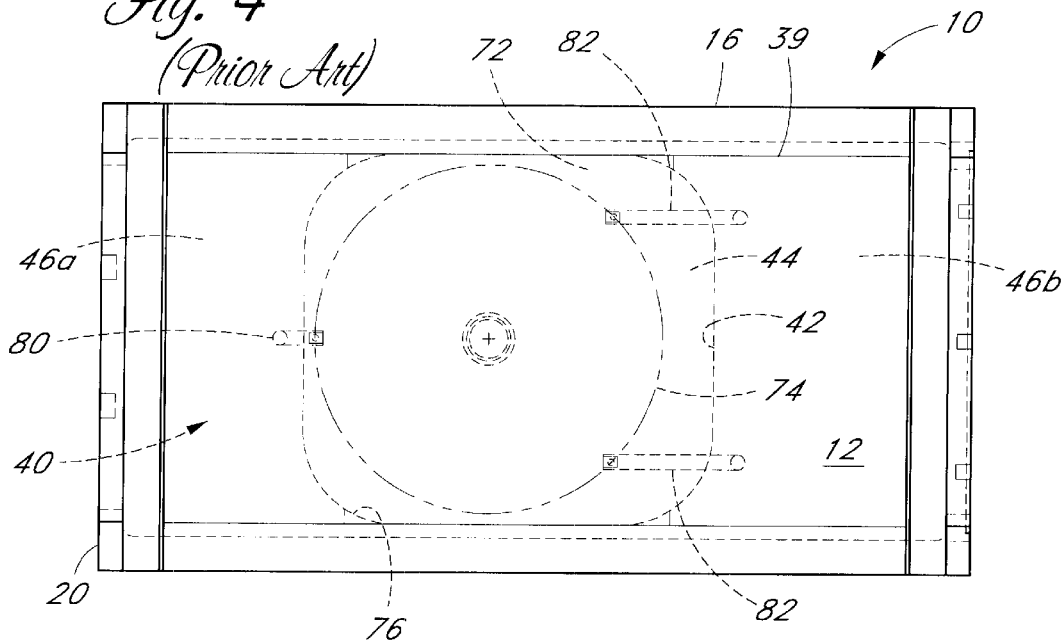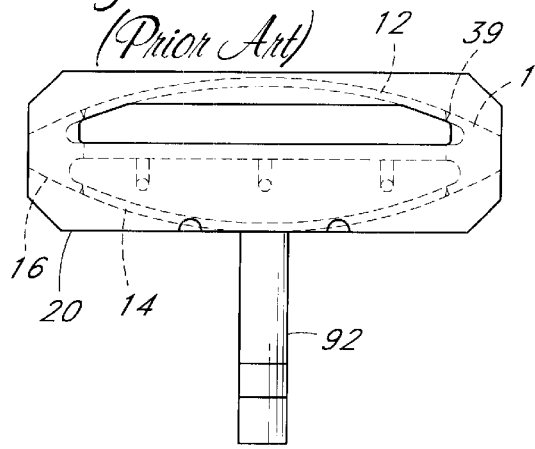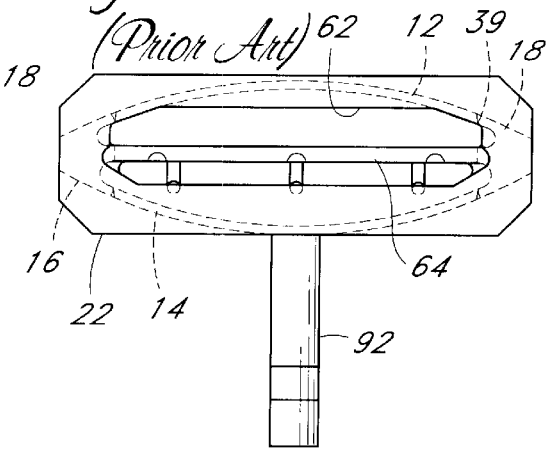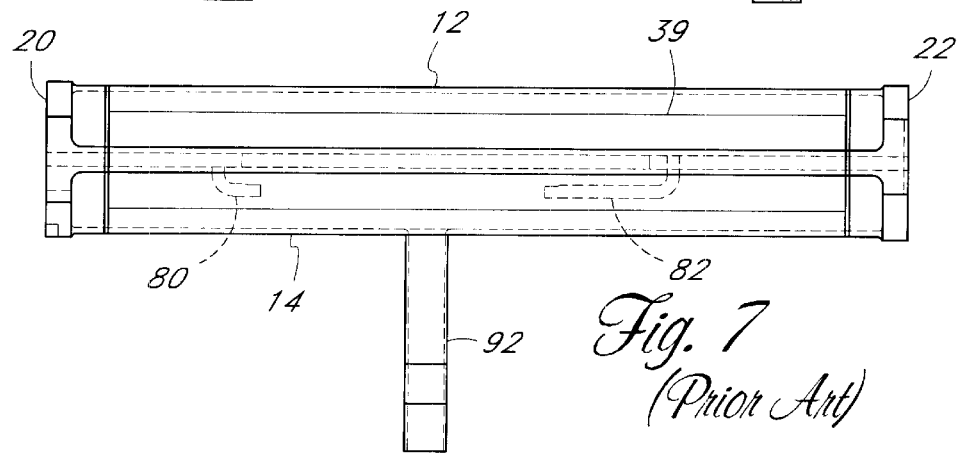

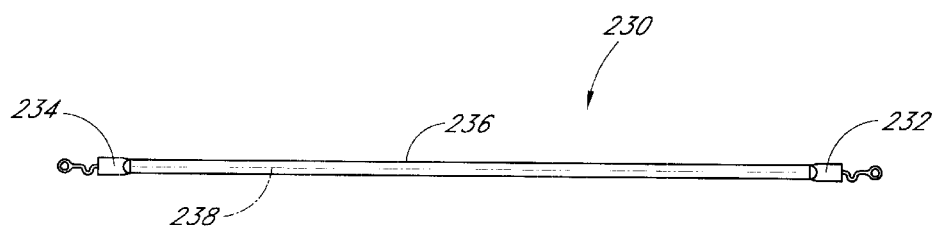
Fig. 11
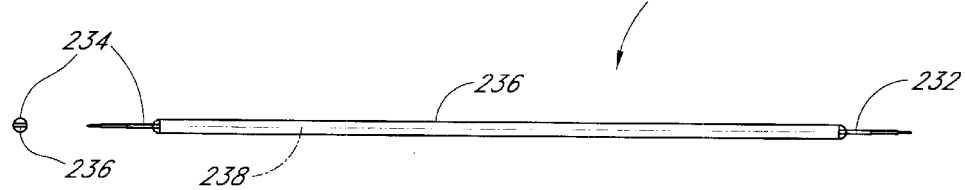
Fig. 13
Fig. 12

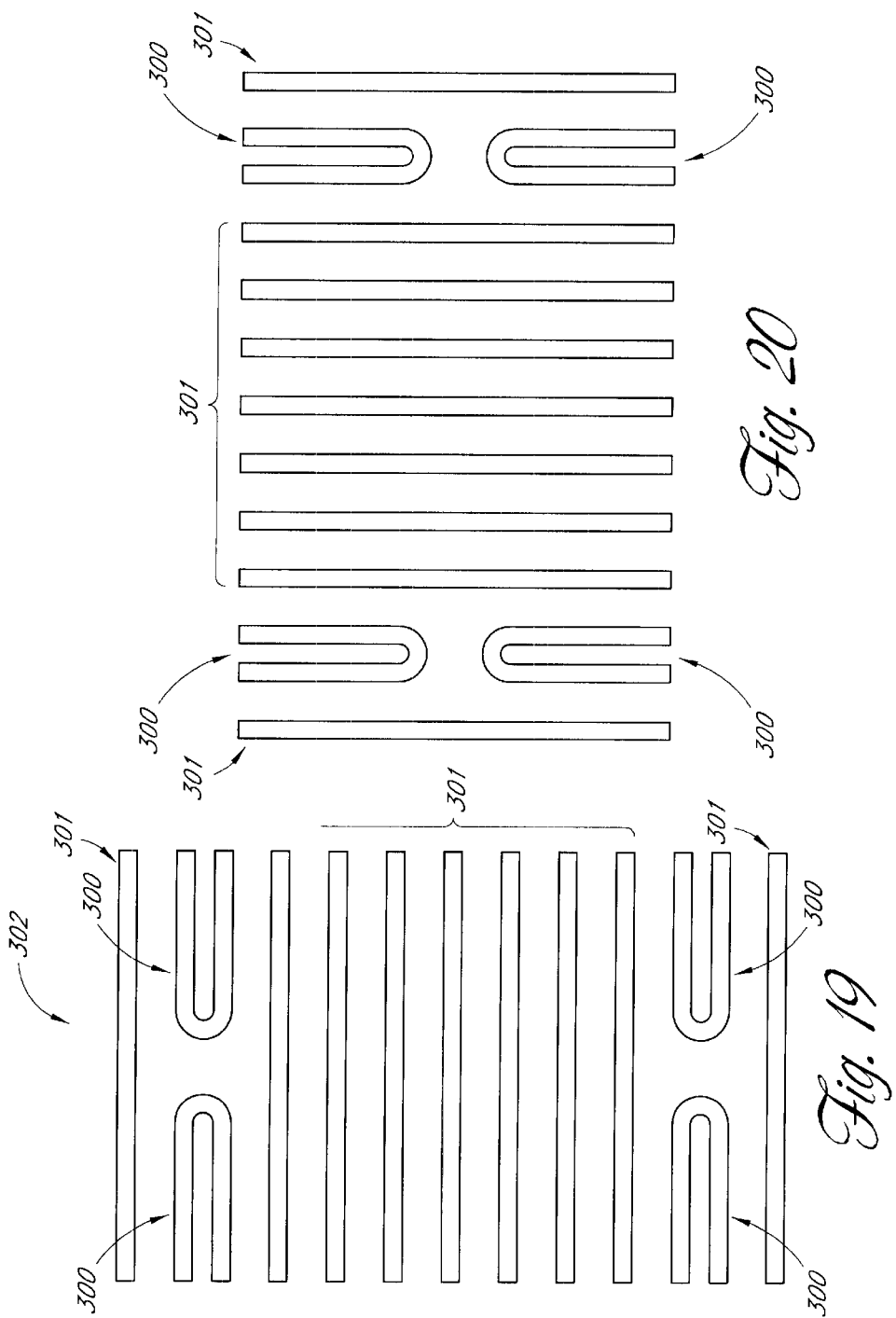

HEAT LAMPS FOR ZONE HEATING

RELATED APPLICATIONS

The present application claims the priority benefit pursuant to 35 U.S.C. § 119(e) of co-pending U.S. Provisional Patent Application No. 60/220,697, which was filed on Jul. 24, 2000.

BACKGROUND OF THE INVENTION

1. Field of the Invention

The present invention generally relates to heat lamps. More specifically, the present invention relates to heat lamps for improving the temperature uniformity in a field heated by an array of heat lamps.

2. Related Art

Chemical vapor deposition (CVD) is a very well known process in the semiconductor industry for forming thin films of materials on substrates, such as silicon wafers. In a CVD process, gaseous molecules of the material to be deposited are supplied to wafers to form a thin film of that material on the wafers by chemical reaction. Such formed thin films may be polycrystalline, amorphous or epitaxial. Typically, CVD processes are conducted at the elevated temperatures to accelerate the chemical reaction and to produce high quality films. Some processes, such as epitaxial silicon deposition, are conducted at extremely high temperatures (>900° C.).

To achieve the desired high temperatures, substrates can be heated using resistance heating, induction heating or radiant heating. Among these heating techniques, radiant heating is the most efficient technique and, hence, is the currently favored method for certain types of CVD. Radiant heating involves positioning infrared lamps around a reaction chamber positioned within high-temperature ovens, called reactors. Unfortunately, radiant energy has a tendency to create nonuniform temperature distributions, including "hot spots," due to the use of localized radiant energy sources and consequent focusing and interference effects.

During a CVD process, one or more substrates are placed on a wafer support (i.e., susceptor) inside a chamber defined within the reactor (i.e., the reaction chamber). Both the wafer and the support are heated to a desired temperature. In a typical wafer treatment step, reactant gases are passed over the heated wafer, causing chemical vapor deposition (CVD) of a thin layer of the desired material on the wafer. If the deposited layer has the same crystallographic structure as the underlying silicon wafer, it is called an epitaxial layer. This is also sometimes called a monocrystalline layer because it has only one crystal structure. Through subsequent processes, these layers are made into integrated circuits, producing from tens to thousands or even millions of integrated devices, depending on the size of the wafer and the complexity of the circuits.

Various process parameters must be carefully controlled to ensure a high quality of layers resulting from CVD. One such critical parameter is the temperature of the wafer during each treatment step of wafer processing. During CVD, for example, the wafer temperature dictates the rate of material deposition on the wafer because the deposition gases react at particular temperatures and deposit on the wafer. If the temperature varies across the surface of the wafer, uneven deposition of the film occurs and the physical properties will not be uniform over the wafer. Furthermore, in epitaxial deposition, even slight temperature nonuniformity can result in crystallographic slip.

In the semiconductor industry, it is important that the material be deposited uniformly thick with uniform properties over the wafer. For instance, in Very Large and Ultra Large Scale Integrated Circuit (VLSI and ULSI) technologies, the wafer is divided into individual chips having integrated circuits thereon. If a CVD process step produces deposited layers with nonuniformities, devices at different areas on the chips may have inconsistent operation characteristics or may fail altogether.

Similarly, non-uniformity or instability of temperature across a wafer during other thermal treatments can affect the uniformity of resulting structures. Other processes for which temperature control also can be critical include oxidation, nitridation, dopant diffusion, sputter depositions, photolithography, dry etching, plasma processes, and high temperature anneals.

One way that reactors have been redesigned to overcome the aforementioned problems is to provide a rotating wafer. An example of one such reactor is shown in U.S. Pat. No. 6,093,252. This reactor includes a circular rotatable susceptor having a diameter slightly larger than the wafer. The susceptor rotates the wafer about an axis normal to the center of the wafer. Rotation of the susceptor causes an averaging of the deposited material growth rates, alleviating the problem of concentration depletion of deposition materials as the reactant gas flows over the wafer. Rotation of the susceptor also helps to average the wafer surface temperature gradient, as all points experience all temperature environments equally. This results in a reduction in the temperature differences both within the susceptor and within the wafer being supported thereon.

In some arrangements, the infrared lamps within the reactor are positioned in manners that will facilitate controlling temperature gradients among various locations within the reaction chamber. For instance, in the illustrated arrangement, the infrared lamps generally are linear in design and are arranged in a pair of crossed arrays. The grid resulting from the crossed array configuration facilitates some control over the temperature uniformity of the wafer by adjusting the power that is delivered to any particular lamp or group of lamps; however, due to the high temperatures involved and the high degree of temperature homogeneity desired, it can be difficult to properly configure the lamp arrays to provide such uniformity.

In an effort to provide more uniform temperature distribution across the wafers, reflectors have been mounted behind the lamps to indirectly illuminate the wafers. The reflectors, or light dams, shield a portion of lamps in localized areas of concern to result in a more balanced temperature profile throughout the chamber. These reflectors generally are made of a base metal and often are gold-plated to increase their reflectivity. Planar reflecting surfaces, however, still tend to induce hot spots on wafers being heated. In addition, while the reflectors can improve the temperature profile, integrating the reflectors into a production facility has been very difficult from an assembly point of view and from an energy efficiency point of view. Furthermore, such constructions further complicate lamp bank design.

Accordingly, a need exists for a system for achieving uniform temperature distributions across semiconductor wafers during processing. Desirably, such a system should maintain the advantages of radiant heating while reducing the complexity of proper lamp bank design.

SUMMARY OF THE INVENTION

In accordance with one aspect of the present invention, a heat lamp is configured with multiple regions having varied relative winding densities. The multiple regions provide greater resolution over placement of infrared power output, and consequently, radiated heat. For instance, by providing two ends of a single lamp with more filament windings per unit length than an intermediate portion of the same lamp, the ends output more radiant energy and heat than the intermediate portion. Thus, the temperature within a region heated by the lamp will vary from one end of the lamp to the other (i.e., hot—cooler—hot).

In accordance with another aspect of the present invention, a heat lamp is configured with a non-linear structure. For instance, the heat lamp may have a generally U-shaped construction such that the lamp has two generally parallel legs separated by a bent portion. Of course, in some applications other non-linear configurations, such as C-shaped, S-shaped, L-shaped, J-shaped and the like can be used. The non-linear structure is especially advantageous in apparatus having multiple lamps operating over a given lamp array width. For instance, in lamp arrays featuring several lamps positioned side by side and extending across a width of the array (e.g., the length of a linear lamp defines a width of the array), a non-linear structure allows control of energy output along the width of the array, by controlling the lamp dimensions and/or energy input independently. In addition, where two lamps are disposed with end portions proximate one another and the leg portions extending in opposite directions, differing energy output can be provided across the array (i.e., the length of the array) as well as across the width of the array.

In accordance with a further aspect of the present invention, a non-linear lamp can be provided with a segmented filament. Such a construction provides the advantages of both constructions discussed above.

An aspect of the present invention also involves a cold wall semiconductor processing apparatus comprising a chamber defined by at least one wall, a structure for supporting a substrate within the chamber and at least one heat lamp disposed proximate the chamber. The at least one heat lamp comprises a first output region and a second output region with the first output region having a first level of radiant energy output and the second output region having a second level of radiant energy output. The first level being greater than the second level.

Another aspect of the present invention involves a chemical vapor deposition apparatus comprising a process chamber having an area for horizontal positioning of a substrate within a substrate treatment zone and having chamber walls for conducting a flow of gas across a surface of the substrate. A first bank of heat lamps are disposed generally above the substrate treatment zone and a second bank of heat lamps are disposed generally below the substrate treatment zone. The first bank has a length and a width with a first set of lamps each having a length that extends across the first bank width. The second bank has a length and a width with a second set of lamps each having a length that extends across the second bank width. The first bank width and the second bank width are disposed in generally parallel planes but extend in directions generally perpendicular to each other. At least one of the first bank and the second bank further comprises at least one lamp having means for adjusting lamp output across the corresponding one of the first bank width and the second bank width.

A further aspect of the present invention involves an apparatus for processing semiconductor wafers at elevated temperatures. The apparatus comprises a high temperature processing chamber defined by at least one wall, a susceptor disposed within the chamber for supporting a wafer to be processed and having a perimeter. A support plate has a surface generally aligned with an upper surface of the susceptor. The support plate defines an elongated opening that is asymmetric relative to the susceptor. In the illustrated embodiment, this asymmetry manifests as a "ring" with a generally rectangular outer perimeter surrounding a round susceptor. A first array of heat lamps is disposed proximate the susceptor and a second array of heat lamps is disposed proximate the susceptor. The susceptor is disposed between at least a portion of the first array and the second array. At least one lamp of the first array or the second array comprises a higher energy output portion and a lower energy output portion. Both of the portions are at least partially disposed within a volume defined by the susceptor perimeter in a direction normal to the susceptor.

An additional aspect of the present invention comprises a method of configuring lamps in a semiconductor processing chamber heated by an array of a plurality of lamps disposed proximate the chamber. The plurality of lamps comprise at least one linear lamp having a length with the length defining a width of the array. The method comprises identifying nonuniformities in the temperature across a substrate, replacing at least one of the plurality of lamps forming the array with a corrective lamp that allows for differential power output across a width of the array. The corrective lamp is corrective in that it compensates for relatively lower or relatively higher temperature zones within the chamber to achieve better temperature uniformity throughout the substrate.

BRIEF DESCRIPTION OF THE DRAWINGS

These and other features, aspects and advantages of the present invention will now be described with reference to the drawings of several preferred embodiments, which embodiments are intended to illustrate and not to limit the invention. The drawings comprise 22 figures.

FIG. 1 is a perspective view of one embodiment of a process chamber that can implement lamps having certain features, aspects and advantages of the invention.

FIG. 2 is a cross-sectional view of the chamber of FIG. 1 taken along the line 2—2.

FIG. 3 is a perspective cross-sectional view of one-half of the process chamber of FIG. 1 taken along the line 3—3.

FIG. 4 is a top plan view of the chamber of FIG. 1 with certain internal components being shown with hidden lines.

FIG. 5 is a view of the inlet end of the chamber of FIG. 1 with certain internal components being shown with hidden lines.

FIG. 6 is a view of the outlet end of the chamber of FIG. 1 with certain internal components being shown with hidden lines.

FIG. 7 is a side elevational view of the chamber of FIG. 1 with certain internal components being shown with hidden lines.

FIG. 11 is a top plan view of a single linear radiant heat lamp.

FIG. 12 is a side view of the linear lamp of FIG. 11.

FIG. 13 is an end view of the lamp of FIG. 11.

FIG. 19 is a schematic plan view of another top lamp array arranged and configured in accordance with certain features, aspects and advantages of the present invention.

FIG. 20 is a schematic plan view of another bottom lamp array also arranged and configured in accordance with certain features, aspects and advantages of the present invention.

DETAILED DESCRIPTION OF THE PREFERRED EMBEDMENTS OF THE INVENTION

Figure 8:
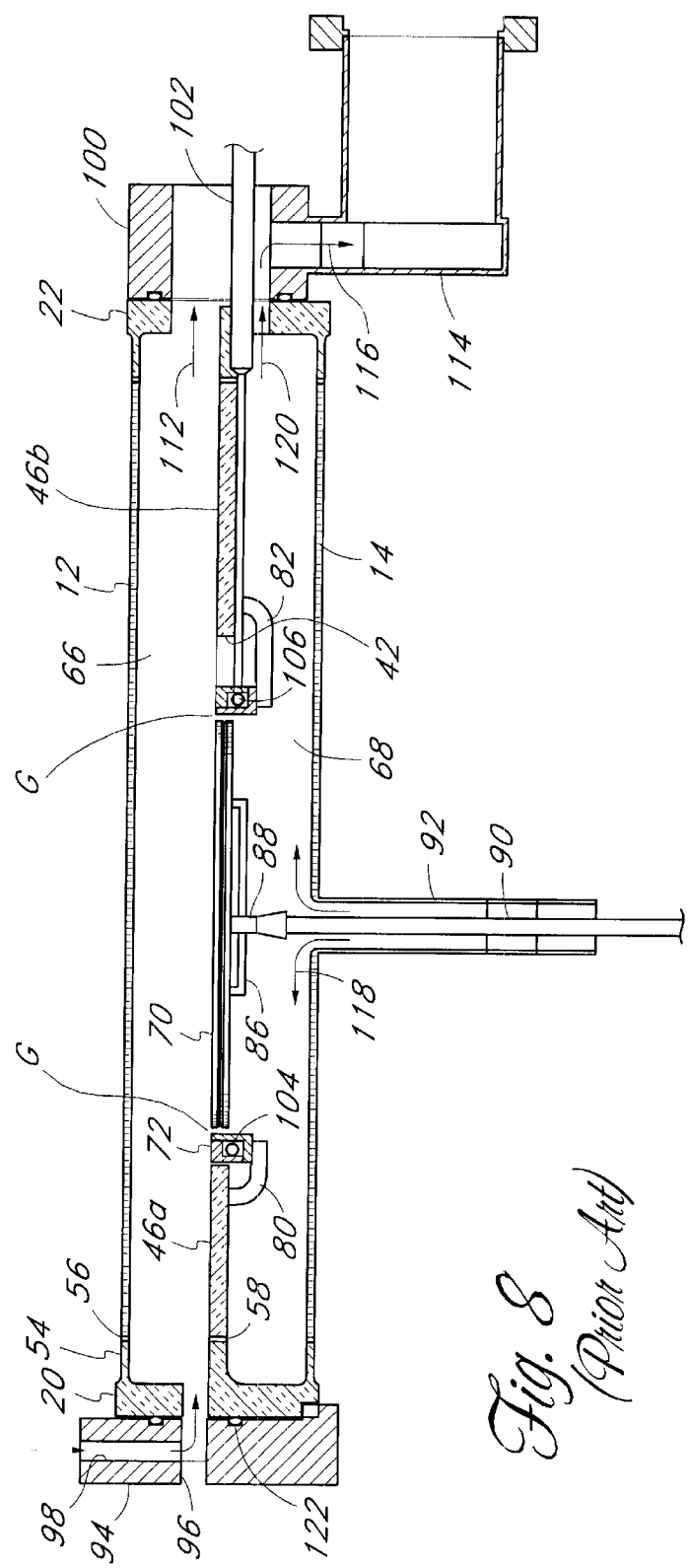
FIG. 8 is a cross-sectional view illustrating the chamber connected to a portion of a wafer processing system.

Prior to describing the lamps and lamp arrays that embody certain features, aspects and advantages of the present invention, reference will be made to two issued patents and a co-pending application that contain certain background information regarding heating systems for use in semiconductor forming equipment.

U.S. Pat. No. 4,836,138, which issued on Jun. 6, 1989 to Robinson et al., and U.S. Pat. No. 4,828,224, which issued on May 9, 1989 to Crabb et al., both of which are hereby expressly incorporated by reference, described exemplary coldwall single wafer reaction chambers. These reaction chambers are exemplary environments in which heat lamps and arrays of heat lamps that are configured in accordance with certain features, aspects and advantages of the present invention can be used. In one preferred arrangement, the heat lamps and arrays are used in CVD chambers. In a more preferred arrangement, the heat lamps are used in CVD chambers that have been optimized for epitaxial deposition.

U.S. Pat. No. 6,093,252, which issued on Jul. 25, 2000 to Wengert et al., also disclosed a reaction chamber configuration that can benefit from the use of heat lamps and arrays of heat lamps having certain features, aspects and advantages in accordance with the present invention. The disclosure of that patent is hereby expressly incorporated by reference. In addition, some of the details of that patent have been reproduced below.

With reference now to FIGS. 1–8, an exemplary reactor chamber 10 for chemical vapor processing and the like is illustrated. As can be seen, the chamber 10 has an elongated, generally flattened configuration, which in cross section has a generally lenticular shape. A lenticular shape has opposed biconvex surfaces which may have circular curvatures. In some configurations, the chamber can have other outer shapes, such as square, rectangular and the like. For instance, a square chamber is disclosed in U.S. Pat. No. 6,143,079, which issued on Nov. 7, 2000, and which is hereby incorporated by reference in its entirety. The illustrated chamber of FIGS. 1–8 has an upper wall 12 with an outer convex surface and an inner concave surface, and a lower wall 14 with an outer convex surface and an inner concave surface. The walls 12 and 14 are connected by vertically short side rails 16 and 18. These walls and side rails are further joined by an upstream inlet end flange 20 and a downstream outlet end flange 22. Upstream and downstream relate to the direction of process gas flow, as will be described, and are synonymous in the present description with front and rear.

With reference now to FIG. 2, both the upper wall 12 and the lower wall 14 are thin, curved plate-like elements having a rectangular flat vertical projection. The walls 12 and 14 desirably have a circular radius of curvature and may be formed by segments cut from a cylindrical tube made of quartz or similar material. In larger chambers, the walls 12 and 14 may be constructed by heating and forming flat quartz plates. Although quartz is preferred, other materials having similar desirable characteristics may be substituted. Some of these desirable characteristics include a high melting point, the ability to withstand large and rapid temperature changes, chemical inertness, and a high transparency to light.

The thick side rails 16, 18 may be machined from a quartz rod of rectangular cross section or otherwise formed into the cross sectional shape illustrated in FIG. 2. More specifically, each side rail 16, 18 includes a reinforced main body having an upper surface 24 that forms a continuation of the curved exterior surface of the upper wall 12, and a lower surface 26 which is curved to form a continuation of the exterior surface of the lower wall 14. The laterally exterior surface 28 of each side rail 16, 18 is flat and extends vertically. The interior surface of each side rail 16, 18 is formed with longitudinally extending upper and lower recesses 30a, 30b that create upper, middle and lower stub wall segments 32a, 32b, 32c, respectively. The upper and lower stub wall segments 32a, 32c mate with the side edges of the upper and lower walls 12 and 14 at longitudinal weld joints 39. In one embodiment, the main body of the side rails 16, 18 has a thickness or width dimension of about 20 mm and a height of about 21 mm.

In the illustrated arrangement, a support or stringer preferably is provided in the form of a flat, rectangular plate 40 that extends between the side rails 16 and 18. As seen in FIG. 4, the support plate 40 includes an aperture 42 defining a void or opening 44 extending across the width of the chamber 10 and dividing the support plate 40 into an inlet section 46a and an outlet section 46b. The inlet section 46a extends from the inlet flange 20 to an upstream edge of the opening 44, and the outlet section 46b extends from a downstream edge of the opening 44 to the outlet flange 22. As may be seen from FIG. 4, the inlet section 46a of the support plate is shorter in the longitudinal direction than is the outlet section 46b. More specifically, in a preferred arrangement, the inlet section is about 70% of the length of the outlet section. That proportional arrangement generally relates to the process gas flow through the chamber.

As best seen in FIG. 2, each of the side rails 16 and 18 includes the inwardly extending central stub wall 32b that in effect forms an extension of the support plate 40. In this respect, the support plate 40 in practice terminates at the main body of the side rails 16, 18, or, in other words, at the laterally outer extent of the recesses 30a, 30b. Longitudinal joints 48 indicate the welded connection between the lateral edges of the support plate 40 and the central stub walls 32b of each of the side rails 16 and 18. The central stub walls 32b precisely bisect the upper and lower walls 12 and 14, and the support plate 40 thus lies on the exact centerline or center plane therebetween.

With reference to FIGS. 1 and 3, each of the end flanges 20, 22 comprise outer, generally rectangular slabs 50, 51, respectively, having chamfered corners 52 and inner lenticular shaped extensions 54. With reference now to FIGS. 1 and 3, the inner extensions 54 conform to the shapes of the upper and lower walls 12, 14 and the central support plate 40. More particularly, short longitudinal portions extend from the slabs 50, 51 to join with each of these plate-like members 12, 14, 40. At each end of the chamber 10, curvilinear weld joints 56 are formed between the curved upper and lower walls 12, 14 and the upper and lower portions of the extensions 54, while linear joint lines 58 are defined between central portions of the extensions 54 and the longitudinal ends of the support plate 40.

The slab 50 of the inlet flange 20 includes a laterally extending aperture 60 (see FIG. 3) in an upper portion which leads into an upper region 66 (see FIG. 2) within the chamber 10 above the support plate 40 and below the upper wall 12. The slab 51 of the outlet flange 22, in contrast, includes a pair of laterally extending apertures 62, 64 (see FIG. 3); the upper aperture 62 communicates with the upper region 66 (see FIG. 2) of the chamber 10 previously described, while the lower aperture 64 communicates with a lower region 68 (see FIG. 2) of the chamber 10 defined below the support plate 40 and above the lower wall 14. The rounded recesses 30a, 30b in the side rails 16, 18 define lateral boundaries of the upper and lower regions 66, 68. As will be described below, the wafer processing is done in the upper region 66 only, with the support plate 40 defining the lower boundary of the process zone.

The opening 44 in the support plate 40 is dimensioned to receive a susceptor 70, as illustrated in FIGS. 3 and 8, and a temperature compensation ring 72 (see FIGS. 4 and 8), which surrounds the susceptor 70. The temperature compensation ring 72 has a thermal mass configured to help increase temperature uniformity in the chamber. In one configuration, the ring itself is asymmetric relative to a wafer being processed, such that the ring has a different center of thermal mass than the wafer or an uneven distribution of thermal mass about the wafer. For instance, in one arrangement, the ring can have a substantially rectangular outer perimeter that results in high thermal mass concentrations at the corners but a similar center of thermal mass relative to the wafer. In other arrangements, the ring can have an off-center configuration (e.g., the illustrated elongated rectangle) in which the distribution of thermal mass about the wafer is uneven. For instance, the ring can receive the wafer in a location other than its center. Of course, the ring can be triangular, circular, elliptical, or any other suitable shape, depending in part upon the geometry of other features in the chamber and the gas flow path.

The susceptor 70 is adapted to rotate within the stationary ring 72 and is preferably spaced therefrom across a small annular gap G of about 0.5 to 1.0 mm. The centerline of a generally circular temperature compensation ring 72 is schematically illustrated in FIG. 4 by the broken line circle 74 shown therein. The shape of the aperture 42 in the support plate 40 surrounding the ring 72 can also be made circular so that the edges of the opening 44 would be in close proximity to the ring. However, it has been found that somewhat of a rectangular aperture 42 having rounded corners, as shown in FIG. 4, is preferred. The support plate sections 46a, 46b may be cut to provide those exact shapes; or for manufacturing convenience, short, somewhat triangular sections 76 of fill, shown in FIG. 4, may be welded to the plate sections and the chamber side rails 16, 18 to provide the desired configuration.

It will be noted that the circle 74 shown in FIG. 4, which represents the centerline of the temperature compensation ring 72 (see FIG. 8), is neither centrally positioned with respect to the upstream and downstream ends of the chamber, nor with respect to opening 44. Instead, the upstream or leading edge of the circle 74 is closer to the downstream edge of the inlet plate section 46a than is the downstream or trailing edge of the circle to the upstream edge of the outlet plate section 46b. This arrangement helps maintain the strength of the chamber by reducing the rate of devitrification of the upstream edge of the outlet plate section 46b. That is, the gas flow heats up as it passes over the susceptor so that the temperature in the chamber walls tends to be the greatest just downstream from the susceptor. The upstream edge can therefore be exposed to significant thermal cycling and devitrification if too close to the susceptor, and thus the susceptor is offset forwardly within the opening 44 to increase the spacing therebetween.

In some configurations, the offset arrangement discussed directly above also affects the flow of the process gases through the chamber. More particularly, the wafer placed upon the susceptor which is surrounded by the ring is positioned close to the downstream edge of the inlet plate section 46a to minimize the amount of reaction gases which pass through the opening 44 upstream of the wafer. This minimizes the amount of reaction gas which can deposit underneath the susceptor in the lower portion 68 of the chamber 10. It also should be noted that this configuration increases the difficulty in obtaining a uniform temperature region proximate the wafer.

With continued reference to FIGS. 4 and 8, the temperature compensation ring 72 is supported by three elbow-shaped support elements having vertically extending portions being welded to the support plate sections. More specifically, a front support element or finger 80 is welded to the rear of the front plate section 46a midway between the rails 16, 18 of the chamber, and the horizontal portion of the finger or element 80 extends rearwardly into the opening 44 so as to be positioned under the leading edge of the temperature compensation ring 72. A pair of spaced elements or fingers 82 have elongated horizontal portions that extend forwardly beneath the trailing edge of the compensation ring 72 as seen in FIG. 8, as well as FIGS. 2–7. Preferably, each of the fingers or elements 80, 82 includes a pin (not shown) that underlies the compensation ring 72. The compensation ring 72 is thus supported in a horizontal plane at three points by upstanding pins (not shown) in the fingers or elements 80, 82. The pins may eventually deteriorate from repeated thermal cycling and exposure to process etch gases, but they can be replaced fairly readily.

In FIG. 8, a susceptor 70 is shown supported on arms 86 of a suitable support 88 connected to the upper end of a rotatable shaft 90 that extends through a tube 92 depending from the bottom wall of the chamber. The susceptor 70 is shown approximately level with the upper edge of the ring 72 and with the upper surface of the support plate 40. This enables a wafer to be positioned above the susceptor 70 and in the upper portion 66 of the process chamber 10.

Still referring to FIG. 8, the inlet flange 20 is adapted to be connected to an inlet component 94 having a horizontally elongated slot 96 through which a wafer may be inserted, and having an elongated inlet 98 for introducing process gas into the upper portion 66 of the chamber after an isolation valve leading from the slot 96 to a wafer handling chamber (not shown) has been closed. Correspondingly, the outlet flange 22 is adapted to mate with an outlet component 100 for exhausting process gas 112 from the chamber 10, as well as applying a vacuum to the chamber. As can be seen from FIG. 8, the outlet flange 22 is open to the lower portion 68 of the chamber beneath the support plate as well as the portion 66 above the support plate.

A plurality of thermocouples 102 extends through the outlet component 100 and into the lower portion 68 of the process chamber. The thermocouples 102 extend into proximity of the susceptor 70 to sense the local temperature surrounding the susceptor 70 and wafer positioned there above. As has been described previously in U.S. Pat. No. 6,093,252, the advantageous positioning of the sensing ends of the thermocouples 102 surrounding the susceptor 70 allows comprehensive feedback regarding the temperature of the wafer and enables adjustment of radiant heating lamps, which will be described later, to compensate for temperature irregularities. More particularly, a leading edge thermocouple 104 terminates proximate the front end of the susceptor 70, a trailing edge thermocouple 106 terminates proximate a rear edge of the susceptor and a lateral thermocouple (not shown) terminates proximate a lateral edge of the susceptor. Each of the thermocouples 102 enters the temperature compensation ring 72 which is formed of two parts to provide a hollow interior therein. Again, this ring has been described previously in U.S. Pat. No. 6,093,252, which is hereby expressly incorporated by reference.

Preferably, the temperature compensation ring 72 is constructed of graphite or other such high heat absorbency material. The ring 72 provides several advantages in the processing environment, primarily reducing edge heat losses from the susceptor 70. More specifically, the ring 72 closely surrounds the edge of the susceptor 70 and is maintained at a similar temperature during processing, as the materials are similar. The susceptor and ring thus radiate heat toward one another to greatly reduce any radiant losses therebetween. Another advantage of the temperature compensation ring 72 is preheating and postheating of the reactant gas in the region of the wafer. Specifically, the reactant gas enters the chamber at an ambient, non-reacting temperature and is heated to a temperature suitable for deposition as it passes over the susceptor and wafer. The surrounding temperature compensation ring 72 thus preheats the reactant gas stream before it reaches the leading edge of the susceptor, and, subsequently, the leading edge of the wafer. The process gas thus reaches an approximately steady state temperature before traveling over the edge of the wafer. Additionally, the temperature of the gas does not significantly drop off after passing the downstream edge of the wafer as the temperature compensation ring 72 extends the downstream heating region. In some arrangements, the ring may be elongated in a downstream direction such that the temperature drop occurs further downstream from the wafer.

The gas flow through the chamber is shown in FIG. 8. Reactant gas enters through the inlet component 94 with a predetermined lateral velocity profile, such as the profile described in U.S. Pat. No. 5,221,556, the entirety of which is hereby expressly incorporated by reference. The predetermined velocity profile provides a larger gas flow towards the central portion of the reaction chamber 10 than the laterally outer edges to compensate for the longer deposition travel path over the center of the circular wafer supported on the susceptor 70. In other words, a greater amount of reactant gas is provided over the central portion of the wafer due to reactant depletion along that flow path over the wafer.

The reactant gas continues longitudinally rearward as indicated by arrow 112 and exits through the outlet component 100 and downward through exhaust conduits 114, as indicated with arrow 116. Typically, purge gas is supplied upward through the hollow tube 92 surrounding the shaft 90, the tube being sized to provide a gas passage surrounding the shaft. The purge gas enters the lower portion 68 of the chamber 10 as indicated by arrows 118. The purge gas prevents unwanted deposition of particulates underneath the susceptor 70 and exits through the lower longitudinal aperture 64 in the outlet flange 22, as indicated by arrow 120. The purge gas then mixes with the spent reaction gas and continues down along the path of arrow 116 through the exhaust conduits 114.

With reference again to FIGS. 1–7, the end flanges 20, 22 are preferably translucent and fabricated from quartz having nitrogen bubbles dispersed therein. The central thin walls 12, 14 and support plate 40, on the other hand, are transparent to radiant energy, allowing radiant heating of the susceptor and wafer in the chamber 10, without creating high temperatures in these structures. The translucent flanges 20, 22 scatter radiant energy to reduce "light-piping" therethrough. This protects O-rings 122 outside of the flanges 20, 22 from exposure to extreme temperatures generated within the chamber 10. Preferably, a section of the tube 92 below the lower wall 14 is similarly translucent from nitrogen bubbles dispersed therein.

Figure 9:
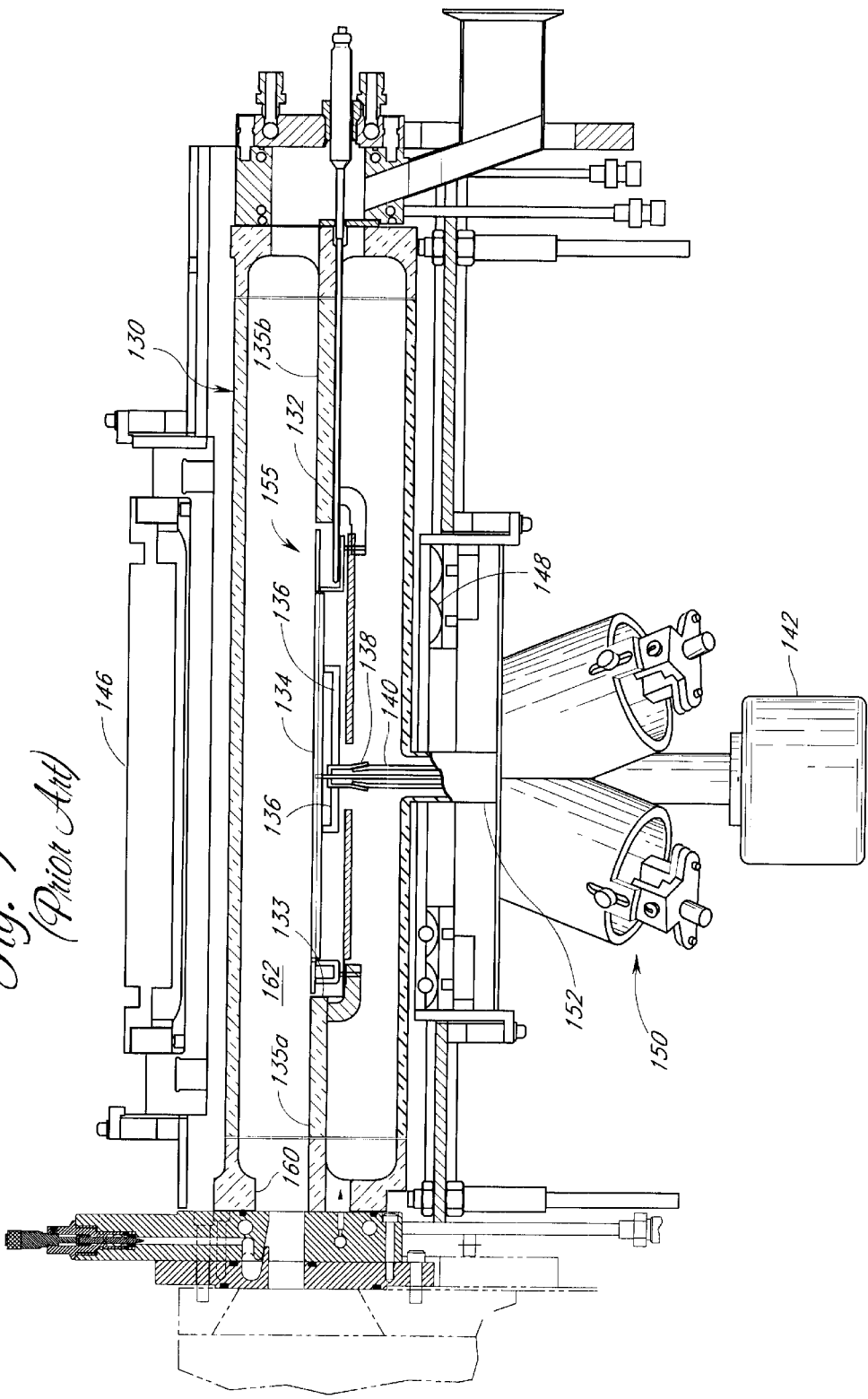
FIG. 9 is a cross-sectional view illustrating a processing system environment that includes an arrangement of radiant heat lamps disposed above and below another chamber configuration.

FIG. 9 illustrates a particular arrangement of components surrounding a modified reaction chamber 130 that can be used for CVD processing. The chamber 130 includes an inner support plate 132 which is similar to the inner support plate 40 as previously described, and thus includes an aperture 133 formed therein. The aperture 133 is sized to receive a temperature compensation ring 155 and a susceptor 134 for supporting a semiconductor wafer. The support plate 132 is divided into a front section 135a upstream of the aperture 133 and a rear section 135b downstream of the aperture 133. The susceptor 134 is positioned on a plurality of radially extending arms 136 of a central hub 138 mounted on a hollow shaft 140. The shaft 140, in turn, is rotated by a motor 142 disposed below the chamber 130. The rotational coupling between the motor 142 and the shaft 140 is explicitly described in U.S. Pat. No. 6,093,252, previously incorporated by reference. The motor 142 preferably is mounted on a fixed frame and includes adjustment mechanisms for properly positioning the susceptor 134 within the chamber 130.

A plurality of radiant heat lamps are arranged around the reaction chamber 130 to heat the susceptor 134 and any wafer thereon. A first bank of upper lamps 146 extends longitudinally with respect to the chamber 130. A second lower bank of lamps 148 extends laterally with respect to the chamber 130. The distribution of the upper bank of lamps 146 is unimpeded so that a regular sequence of lamps is provided across the lateral extent of the chamber 130. The lower bank of lamps 140, on the other hand, is provided on both sides of the shaft 140, but is discontinued in the region surrounding the shaft. Thus, one or more spot lights or directed lamps 150 are positioned under the chamber 130 and surrounding a downwardly depending quartz tube 152 formed integrally with the chamber 130. The tube 152 concentrically receives the shaft 140. The tube 152 and shaft 140 create an annular space therebetween which is used to inject a purge gas into a region underneath the susceptor 134. The directed lamps 150 radiate energy to the underside of the susceptor 134, which may be shadowed by the shaft 152 and supporting structure. The specific heating arrangement is similar to that described and illustrated in U.S. Pat. No. 4,836,138, which is hereby expressly incorporated by reference.

The upper and lower banks of lamps 146, 148 are distributed in a generally rectangular configuration above and below, respectively, the susceptor region 134. This arrangement, in combination with the directed lamps 150, focuses the radiant energy on the susceptor 134 and the associated wafer. In addition, the perpendicular orientation of the upper and lower banks 146, 148 further enhances uniformity of heating of the susceptor 134. An enlarged temperature compensation ring 155 is shown in FIG. 9. It should be noted, however, that the peripheral shape of the modified temperature compensation ring 155 is generally rectangular and the shape generally conforms to the radiant heat from the upper and lower banks of lamps 146, 148. This arrangement is highly efficient and results in more uniform temperatures across the susceptor 134. Nevertheless, some temperature nonuniformity may still exist for reasons that will be discussed below.

Figure 10:
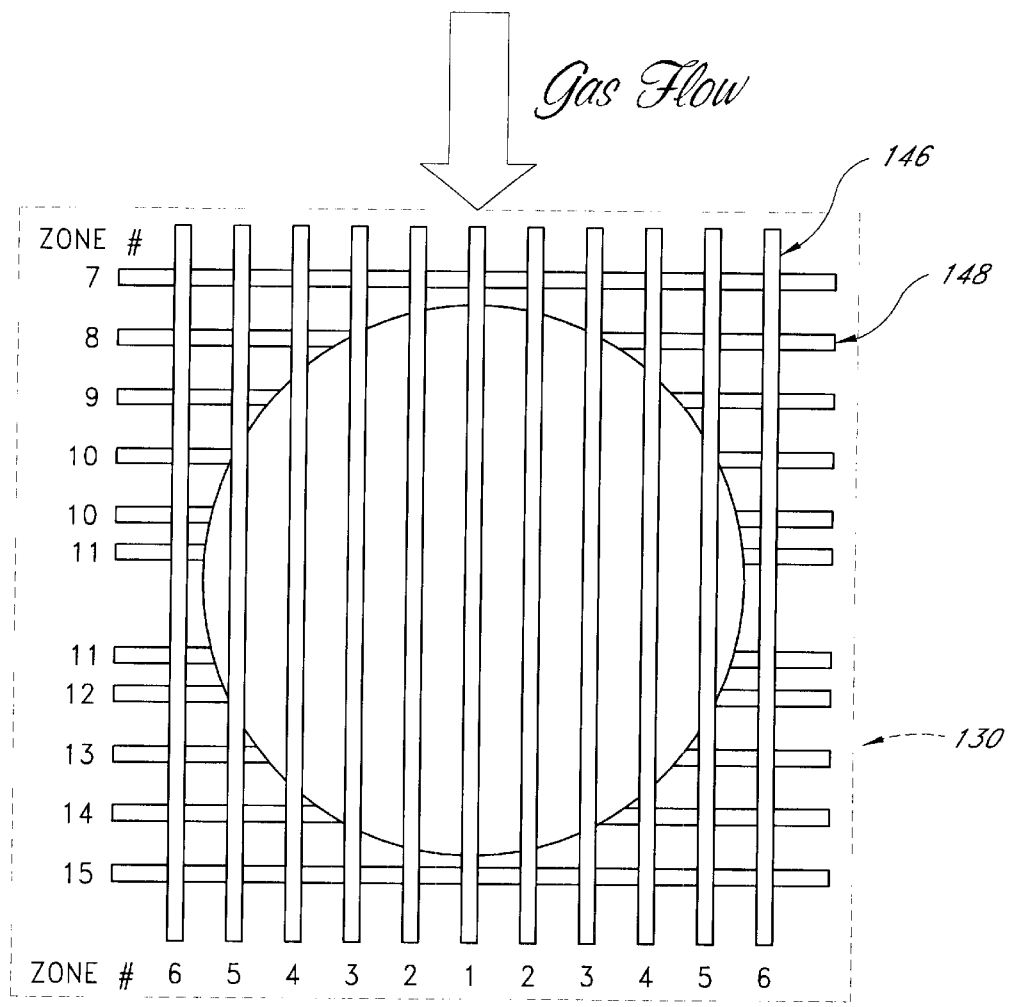
FIG. 10 is a schematic top plan view of a portion of a portion of a processing system environment, illustrating an arrangement of radiant heat lamps disposed above and below an exemplary wafer.

With reference now to FIG. 10, a typical grid of heat lamps, which is fashioned from the top array of lamps 146 and the bottom array of lamps 148, is illustrated therein. In the illustrated arrangement, a wafer is disposed within the reaction chamber 130 in a position generally between the top array of lamps 146 and the bottom array of lamps 148. It should be noted that, in some chambers, the top array and the bottom array can be constructed differently. For instance, in the arrangement of FIG. 9, the bottom array 148 generally accommodates the spot lamps 150, the rotating shaft 140 and the gas supply tube 152. Thus, the central region of the bottom array does not admit to full linear lamps passing from one side to the other. To the contrary, in such a configuration, the top array would not have such obstructions and full linear lamps passing from one side to the other are easily accommodated and implemented.

With continued reference to FIG. 10, in one arrangement of the grid, the lamps are linear and eleven lamps make up each of the top array and the bottom array. It should be noted that other numbers of lamps also can be used. The lamps 146 of the top array preferably extend generally perpendicular to the lamps 148 of the bottom array. Generally, the lamps 146, 148 receive differing power levels to account for end effects and other phenomena that can vary the temperature gradient across the wafer. The differing power levels result in a number of zones. In the illustrated arrangement, six zones are provided in the top array (i.e., zones 1–6) and nine zones are provided in the bottom array (i.e., zones 7–15). These zones receive differing levels of power such that the temperature gradient across the wafer can be substantially uniform across all portions of the wafer surface. The lamps 146, 148 can be individually controlled or controlled in the illustrated groups or zones. Each zone can be associated with a temperature control module based on feedback from temperature sensors (e.g., the thermocouples 102, 104, 106 of FIG. 8).

With reference now to FIGS. 11–13, a typical lamp 230 is illustrated therein. The illustrated lamp 230 generally comprises two connectors 232, 234 disposed at opposite ends of a tube 236. A filament 238, shown schematically in FIGS. 11 and 12, extends through the tube 236 and is electrically connected to each of the end connectors 232, 234. Thus, when a power source is connected across end connectors 232, 234, the filament 238 receives current and provides a source of radiant energy in a manner generally known to those of ordinary skill in the art. Lamps can have. varied dimensions depending upon the application and size desired.

With this background in mind, it has been discovered that the differing allocations of thermal mass within the chamber relative to the wafer can result in hot spots and cold spots, or uneven temperature distribution, within the reaction chamber and especially across the surface of the wafer. For instance, in a configuration featuring a generally square ring, the corners of the susceptor have an increased thermal mass relative to the balance of the susceptor. In one application, when a 300 mm wafer was processed in a reaction chamber such as that described above, the corners of the square compensation ring were "cold" spots because the corners of the ring operated as "cooling fins" due to their large surface area and edge cooling effects. The "cold" spots on the wafer resulted in relative "hot" spots on the wafer adjacent a central portion of the ring. This is highly linked to the $H_2$ gas velocity, which directly effects the heat transfer coefficient of the corner graphite, while the susceptor is somewhat decoupled due to the presence of an additional thermal resistance—i.e., the wafer. Thus, the corners cool more and, therefore, draw heat away from the wafer.

The lamp arrays and lamp constructions, which will be described below, are configured in accordance with various features, aspects and advantages of the present invention and can be used to compensate for such effects using zonal control and segmented and/or non-linear lamp construction.

Figure 14:
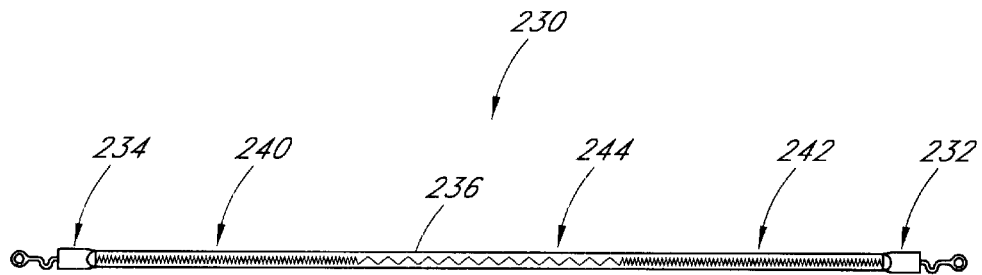
FIG. 14 is a top plan view of a segmented linear lamp having certain features, aspects and advantages of the present invention.

Thus, in accordance with certain features, aspects and advantages of the present invention, at least one, but preferably more than one, of the lamps 230 disposed in at least one of the top and bottom arrays comprises a segmented lamp. A segmented lamp 230 is achieved by manipulating the number of filament windings, or density, across the total filament length. Thus, the segmented lamp 230, which is illustrated in FIG. 14, comprises a filament 238 that extends between the end connectors 232, 234 within the tube 236. The filament 238 preferably has more than one region as indicated by changes in the number of windings of the filament 238.

The number of windings per unit length (e.g., inch), or winding density, can be varied along the length of the tube 236 (i.e., the distance between the connectors 232, 234). For instance, in the illustrated arrangement, two relatively tightly-wound segments 240, 242 are separated by a relatively loosely-wound segment 244. The resultant lamp 230 features regions of relatively high energy output (i.e., high heat) that correspond to segments 240, 242 and a region of relatively low energy output (i.e., low heat) that corresponds to segment 244. The center segment 244 acts as an "inactive" portion of the lamp 230 since the power dissipated in this section is a small fraction of the power dissipated in the more densely wound segments 240, 242. The segmented lamps 230 (or lamps with inactive sections) can provide extra control or resolution in actual watts/$cm^2$, thereby reducing the complications experienced in power allocation to specific zones (see FIG. 16) and thus reducing the complexity of the lamp bank design.

In the illustrated arrangement, more radiant energy is output by the two end regions 240, 242 of the lamp 230. While the intermediate region 244 provides a connection between the two heating regions 240, 242, it is anticipated that the intermediate portion 244 also will output some degree of radiant energy. This level of radiant energy can be controlled during manufacture of the lamp by changing the density of windings contained within the intermediate region. Of course, if desired, the intermediate region 244 could be rendered substantially inactive with almost no radiant energy output.

Figure 15:
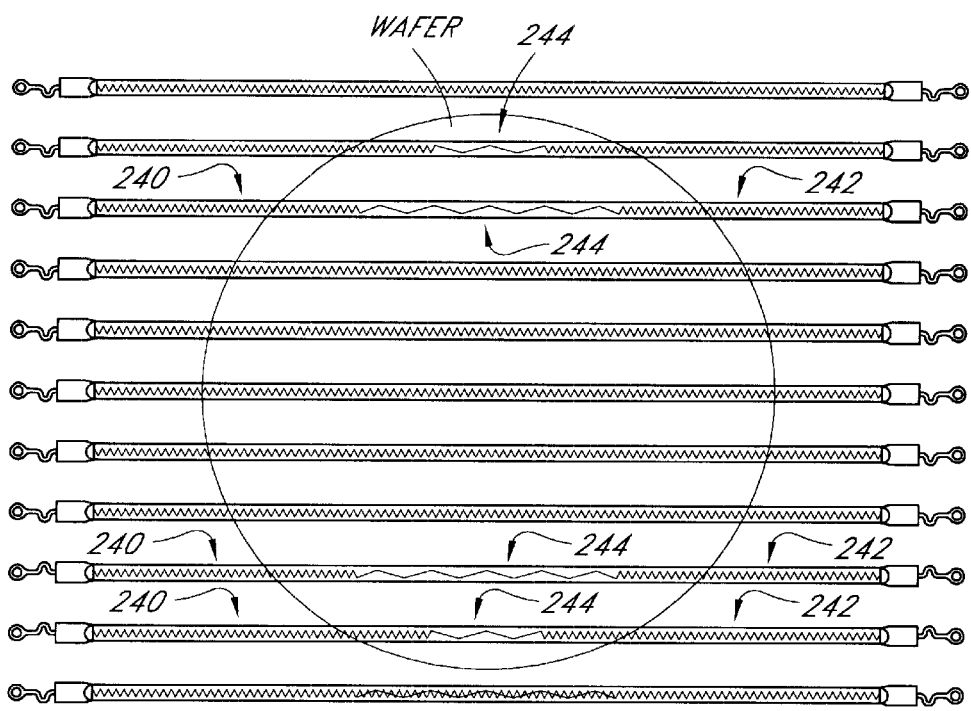
FIG. 15 is a top plan view of a top array of lamps featuring segmented linear lamps.

In the illustrated arrangements, the lamps 230 of the top array 146 preferably comprise an intermediate region 244 that extends along between one-sixth and one-third of the total length of the lamp 230. For instance, in a 16.5 inch lamp, the intermediate region extends between 3 inches and 5 inches in length and is generally centrally located. As illustrated in FIG. 15, the intermediate region 244 can be varied in length depending on the position within the reaction chamber of the segmented lamp.

As with the balance of the grid array (i.e., the standard radiant heat lamps), the individual segmented lamps can receive differing power levels to better control the distribution of temperatures across the wafer. In accordance with certain features, aspects and advantages of the present invention, the segmented lamps increase the amount of control and resolution with a fixed number of zones. Thus, the lamps better control the distribution of temperatures across the wafer by reducing the radiant output proximate the regions that would otherwise be excessively heated using standard linear lamps. In general, by providing the segmented lamps and by increasing the output of the surrounding lamps, the typical regions of excess heat can be reduced or eliminated. This results in a more uniform temperature profile throughout the wafer surface.

Figure 16:
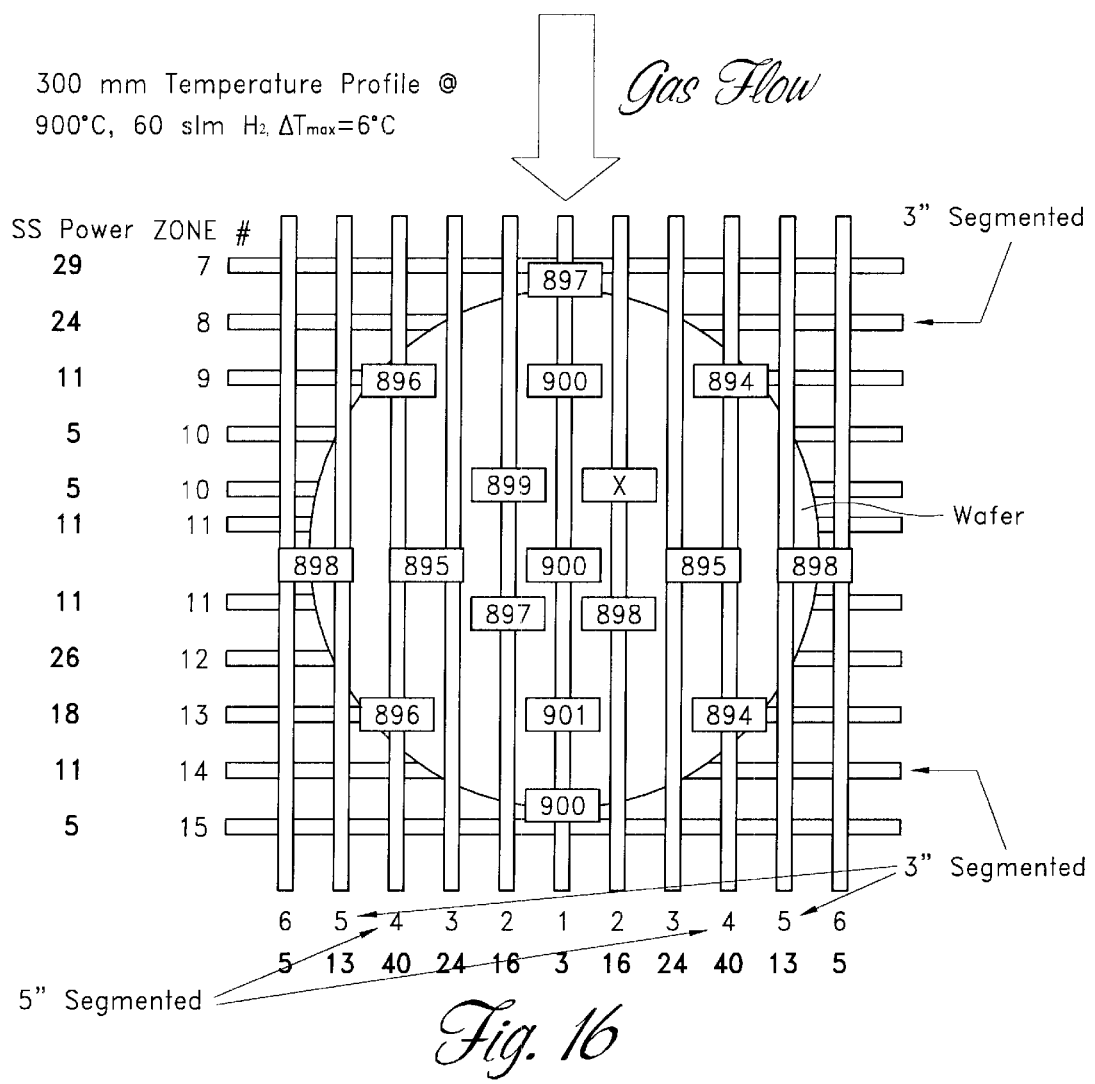
FIG. 16 is an exemplary temperature distribution diagram illustrating the use of segmented lamps in both the top lamp array and the bottom lamp array.

With reference now to FIG. 16, data regarding an exemplary grid are provided within a single diagram. For instance, temperature readings are superimposed upon the grid array to illustrate a distribution of temperatures across the wafer. These temperatures reflect data taken on a 300 mm wafer in the reactor of FIG. 9 when heated to about 900° C. in an environment of 60 SLM $H_2$ with a desired maximum temperature gradient of 6° C. As described above, the illustrated grid features 15 different zones, six of the zones being disposed along the top lamp array while the remaining nine zones are disposed on the bottom lamp array. The relative percentage of power applied to each lamp in an exemplary application also is illustrated in this figure. For instance, in the center zone of the top array, zone 1, the lamp was provided with 3% of maximum power, while in the zone nearest to the in-flow of gas into the reaction chamber of the bottom array, the lamp was provided with 29% of maximum power (i.e., zone 7). As illustrated, the segmented lamps have been used in typical regions of excessive heating and have resulted in cooler temperatures at these intersecting regions.

Figure 17:
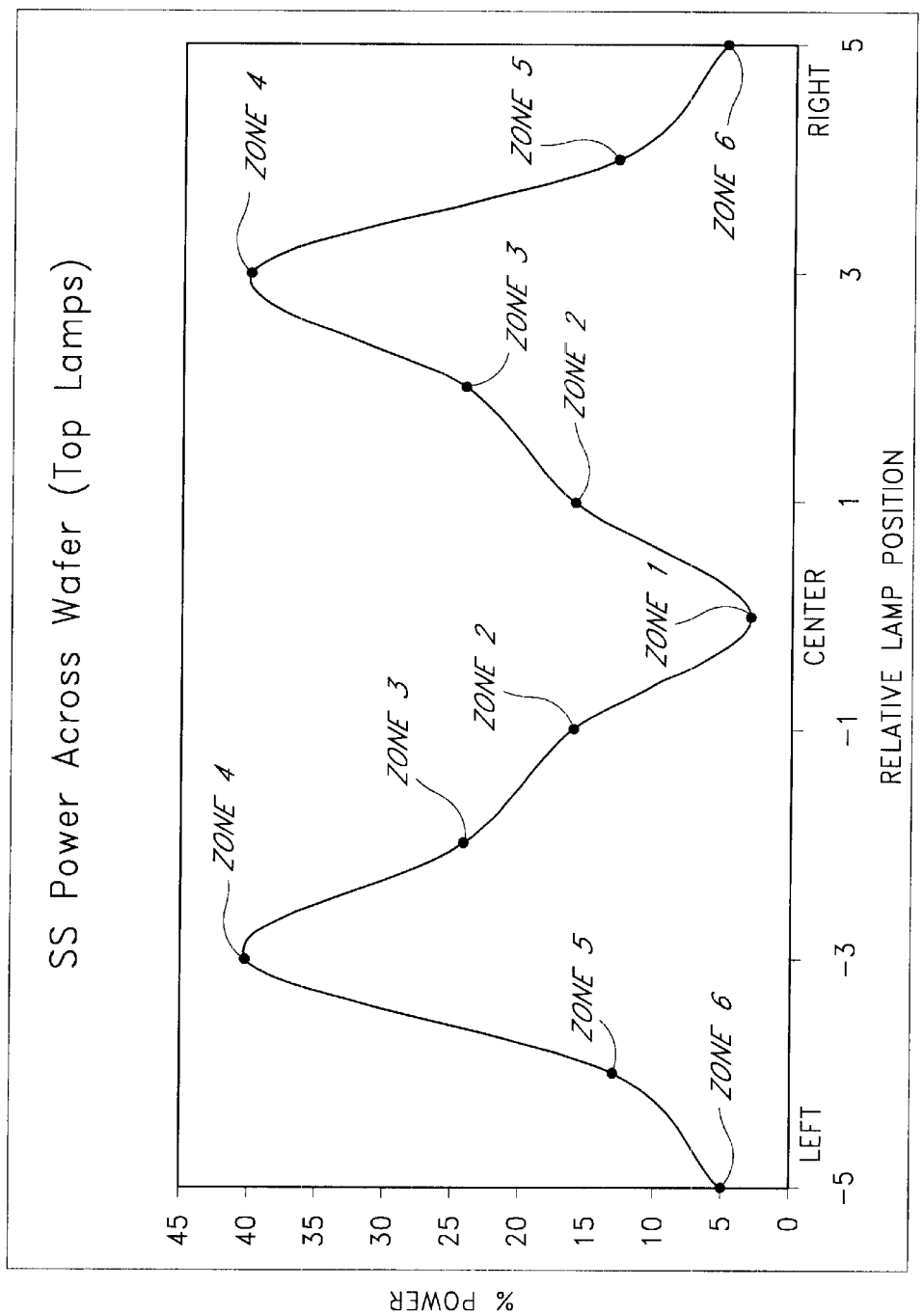
FIG. 17 is a power distribution curve, comparing the percentage of power to the positioning of the lamps relative to the wafer, with discrete points corresponding to each of the lamps of the top array.
Figure 18:
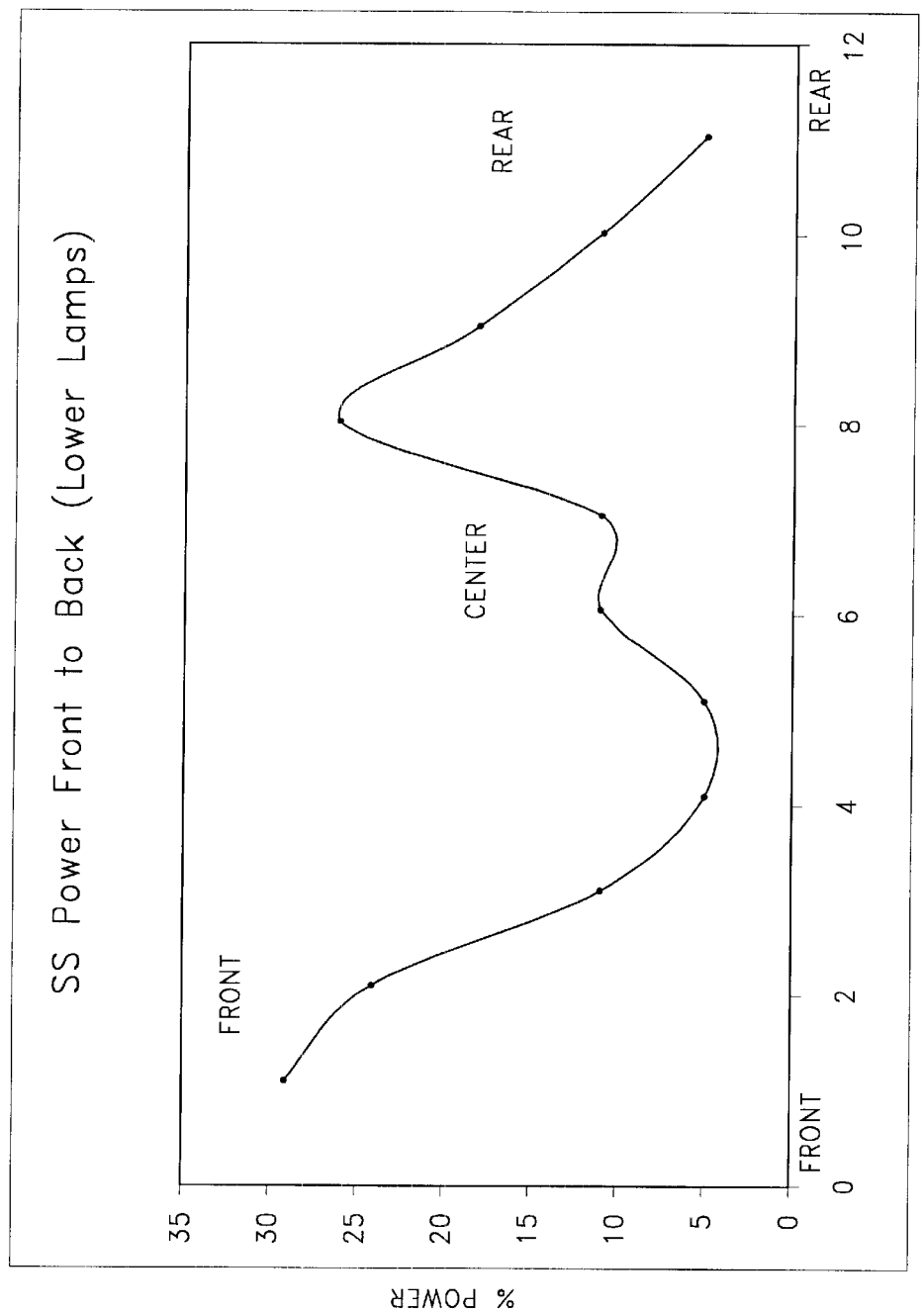
FIG. 18 is a diagram similar to FIG. 17, illustrating the percentage of power from the front to the back within the bottom lamp array.

With reference now to FIGS. 17 and 18, a graphical depiction of the maximum percentage of power across each of the two lamp arrays for the exemplary arrangement is illustrated. With reference first to FIG. 17, the percentage of power across the wafer for the top array (i.e., side to side in the chamber) is illustrated therein. As illustrated, the power level is increased from one edge for approximately a third of the width of the chamber, decreased towards the center of the chamber, increased again, and decreased towards the other side of the chamber. This power distribution accommodates the changes in the lamps and accommodates edge effects and other phenomena that are known to affect the temperature gradient across an individual wafer.

With reference now to FIG. 18, which is a graphical depiction of the maximum percentage of power across the wafer for the bottom array, the distribution is less symmetrical in the bottom array as compared to the top array. Specifically, the power is higher near the front of the array and decreases towards a point just upstream of the center of the array. At center, the power increases slightly, decreases. slightly and then increases again. Approximately two-thirds of the distance across the array from front (i.e., upstream edge) to back (i.e., downstream edge), the power decreases and tapers to the final lamp in the bottom array. Again, this distribution, in combination with incorporating the segmented lamps, accommodates temperature gradient changes normally associated with the wafer in the illustrated reaction chamber. Through the combination of the change in lamp type and the variation of power across the top lamps and the bottom lamps such as those illustrated, a more uniform distribution of temperature is achieved, thus allowing a uniformity of temperature across the surfaces of the wafer that has heretofore not been achieved in the preferred reactor.

With reference now to FIGS. 19 and 20, another arrangement of radiant heat lamps in a top array 302 and a bottom array 304 are illustrated therein. This arrangement also has certain features, aspects and advantages in accordance with the present invention. The arrangements of the lamps illustrated in FIGS. 19 and 20 result in an improved zonal control of temperature within the reaction chamber such that a uniform temperature or a substantially uniform temperature can be achieved across the surfaces of the wafer. As will be appreciated, rather than using the segmented linear lamps described above, this arrangement features at least one, but preferably four, non-linear lamps 300. As will be appreciated, a number of linear lamps 301, which can be segmented (i.e., varying levels of output energy along the length of the lamp) in some applications, also are used in the arrays. In total, each array in the illustrated configuration would comprise thirteen lamps. Of course, the number of lamps can vary depending upon the application, size and configuration of the reaction chamber.

The non-linear lamps 300 extend at least partially into a region that extends over or under the reaction chamber (i.e., a volume defined generally normal to the banks of lamps and a perimeter of the reaction chamber) and preferably are U-shaped such that they double back towards the outside edge of the reaction chamber. This configuration results in controllable zones both across the width of the top bank 302, as well as along the length of the top array 302. As used herein, the width of a bank generally is defined by the length of a single linear lamp between the two connectors while length of a bank is defined by the distance spanned by a number of lamps (i.e., lamp diameters plus spacing between lamps). For instance, in application in which the lamps of the top bank extend parallel to the gas flow, the width of the top bank is a distance defined along the gas flow while the length is a distance defined perpendicular to the gas flow. The same configuration also can be used in the bottom array 304. By using the split non-linear lamps, the distribution of radiant energy can be more closely controlled in the regions for which the control is desired. For instance, the non-linear lamps 300 preferably are disposed in regions that typically receive a high degree of radiant energy (i.e., a hot spot). The non-linear lamps, however, allow the energy to be controlled and adequately placed where desired. Thus, more accurate control of the radiated energy can occur from both the top lamp bank 302 and the bottom lamp bank 304.

Figure 21:
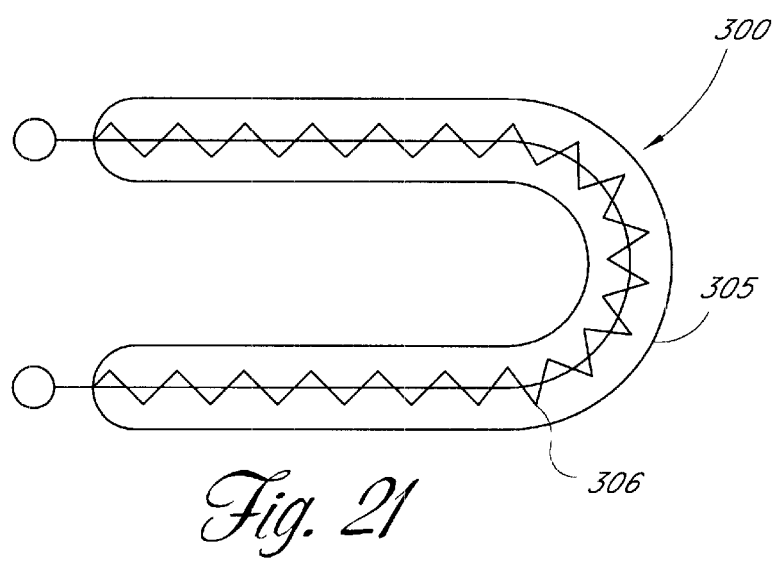
FIG. 21 is a schematic view of an exemplary non-linear lamp arranged and configured in accordance with certain features, aspects and advantages of the present invention and used in arrays such as those illustrated in FIGS. 19 and 20.
Figure 22:
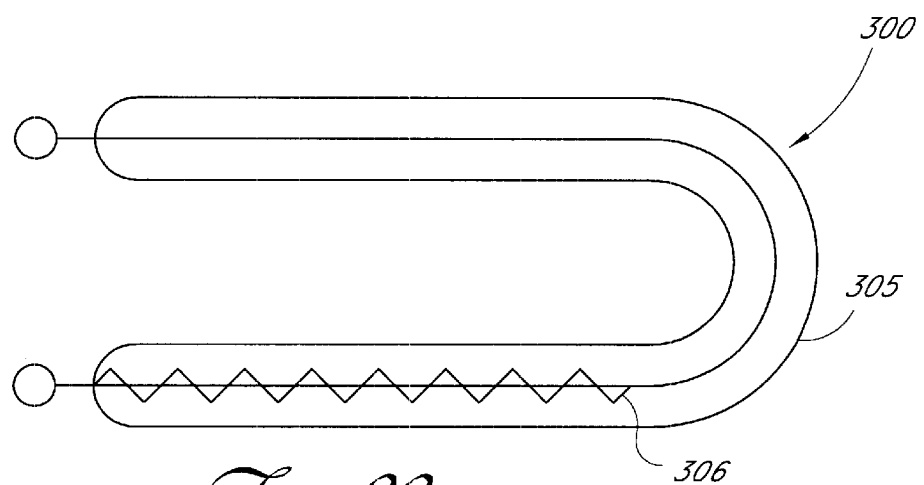
FIG. 22 is schematic view of a segmented non-linear lamp arranged and configured in accordance with certain features, aspects and advantages of the present invention.

With reference now to FIGS. 21 and 22, it can be seen that the non-linear lamps 300 preferably have outer tubes 305 that are U-shaped in configuration and can include filament windings 306 either along the entire length of the tube 305 or over just a portion of that length. The winding density of the filament 306 can also be varied along the length of the tube 305. For instance, the U-shaped or non-linear tube 305 can be provided with the same type of filament 306 associated with the linear segmented lamps described above.

Thus, in one configuration of the lamp, the shape of the lamp has changed from linear to U-shaped such that one or more linear lamps can be replaced by at least one U-shaped lamp. Using the proposed configuration illustrated in FIGS. 19 and 20, two of the linear lamps in the top bank 302 and two of the linear lamps in the bottom bank 304 can be replaced by the U-shaped lamps to attain better temperature uniformity across the wafer. In another configuration, the entire lamp bank can be built from U-shaped tubes. This will lead to better control of the various temperature zones across the surface of the wafer. In yet a further configuration, the lengths of the U-shaped lamps can be differentiated to provide for an overlap for better temperature uniformity and control.

The illustrated U-shaped lamp 300 also allows for easy connection to the SCRs or other suitable power supplies. Thus, by using this design, each of the two ends of the filament can be brought to the respective socket along a single side of the chamber for easy termination. By dividing one linear lamp into two U-shaped lamps, the two U-shaped lamps can be independently controlled. Thus, the U-shaped lamps enhance the heating capability and can be independently controlled. Moreover, by controlling these lamps independently and placing them in strategic locations, especially in combination with the linear lamps, the temperature gradient across the wafer surface can be reduced and better managed. Since a pair of linear lamps are replaced by two U-shaped lamps, the watt density for each of the new lamps can be almost the same after the replacement. This reduces any undue stress on the filament and can lead to an improved lamp life. Additionally, "dead spots" can be selectively created, with little to no power output (e.g., <10% that of other regions of the same lamp.)

By providing the U-shaped or non-linear lamps 300, it is possible to better control the temperature gradient across the wafer. In addition, through the use of the U-shaped, other non-linear and/or segmented lamps, cold spots that commonly are disposed within certain locations (e.g., the corners of the wafer) can be greatly reduced or eliminated. Accordingly, the use of these lamps can reduce or eliminate the effects that require that the temperature be ramped up very slowly in order to avoid slip on the wafers during manufacture. This is possible because, with the two disclosed lamp arrangements, i.e., non-linear and segmented, it is possible to control power distribution to different portions of a single lamp. In this manner, it is technically feasible to adequately control the lamps across the grid arrays to reduce cold spots and hot spots and thereby reduce the temperature gradients across the wafer. Moreover, because the power to different portions of the lamps can be better controlled through these arrangements, it is possible to increase the rate at which the temperature is ramped up while not reducing the quality of the end product.

The segmented linear lamps and the non-linear lamps provide extra control over temperature profile and can save time in setting up the equipment. In addition, these lamps can reduce the complexity of lamp bank design while offering greater. radiant flux resolution. Because of the ability to control power output along the length of the lamp, the use of the segmented lamps can result in greater uniformity with less input than typical radiant heat lamps because the power can be better distributed where needed. Furthermore, changing the lamps to segmented lamps creates a more versatile arrangement when compared to the difficult and time consuming task of installing and removing reflectors or light dams. Along these lines, maintenance is reduced or simplified because changing the segmented lamp is the same as changing a standard linear lamp.

Accordingly, the inventive lamps (i.e., linear segmented, non-linear segmented, or non-linear) can be used in an advantageous method of reducing temperature gradients within a cold wall chamber such that nonuniformities in temperature across a substrate can be reduced or eliminated. In such a method, nonuniformities in temperature within the chamber or nonuniformities across substrate processed within the chamber can be analyzed to determine relative cold spots or hot spots. Once a nonuniformity has been found, some lamps within the arrays, which are used to heat the chamber, can be replaced with a lamp that will provide a differential power output across a region of the array. Such a lamp can be a segmented lamp or can be a non-linear lamp such that increased energy can be positioned proximate a cold spot or such that reduced energy can be positioned proximate a hot spot. In one configuration, the lamp would provide a fixed power ratio between one area of the lamp and another area of the lamp. By using this method, the temperature gradient within the chamber and, therefore across the substrate, can be greatly reduced and the uniformity of the product can be improved. It should be noted that temperature nonuniformities can be determined in any suitable manner, including but not limited to, direct temperature measurements of the substrate, indirect temperature measurements (i.e., measuring temperature within the chamber) or measuring the thickness of the processed materials.

Although the present invention has been described in terms of a certain preferred embodiments, other embodiments apparent to those of ordinary skill in the art also are within the scope of this invention. Thus, various changes and modifications may be made without departing from the spirit and scope of the invention. For instance, various components may be repositioned as desired. Moreover, not all of the features, aspects and advantages are necessarily required to practice the present invention.

We claim:

1. A cold wall semiconductor processing apparatus comprising a chamber defined by at least one wall, a structure for supporting a substrate within said chamber, at least one heat lamp disposed proximate said chamber, said at least one heat lamp comprising a first output region and a second output region, said first output region having a first level of radiant energy output and said second output region having a second level of radiant energy output, said first level being greater than said second level.

2. The apparatus of claim 1, wherein said at least one heat lamp further comprises a third output region, said third output region having a third level of radiant energy output and said third level being greater than said second level.

3. The apparatus of claim 2, wherein said first level and said third level are approximately the same.

4. The apparatus of claim 2, wherein said second output region in interposed between said first output region and said third output region.

5. The apparatus of claim 1, wherein said at least one heat lamp comprises an outer tube and a filament extending at least partway through said outer tube.

6. The apparatus of claim 5, wherein said filament comprises a first winding density within said first output region and a second winding density within said second output region.

7. The apparatus of claim 5, wherein said outer tube is generally linear.

8. An apparatus for processing semiconductor wafers at elevated temperatures, said apparatus comprising a high temperature processing chamber defined by at least one wall, a susceptor disposed within said chamber for supporting a wafer to be processed, said susceptor having a perimeter, a first array of heat lamps being disposed proximate said susceptor and a second array of heat lamps being disposed proximate said susceptor, said susceptor being disposed between at least a portion of said first array and said second array, at least one lamp of said first array or said second array comprising a higher energy output portion and a lower energy output portion, both of said portions being at least partially disposed within a volume defined by said susceptor perimeter in a direction normal to said susceptor.

9. The apparatus of claim 8 further comprising a support plate that defines an opening that is asymmetric relative to said susceptor.

10. The apparatus of claim 9, further comprising a temperature compensation ring surrounding the susceptor within the opening.

11. The apparatus of claim 10, wherein the opening has a generally rectangular shape.

12. The apparatus of claim 8, wherein said at least one lamp comprises an outer tube and a filament extending through said outer tube.

13. The apparatus of claim 12, wherein said outer tube is generally linear.

14. The apparatus of claim 12, wherein said outer tube is generally non-linear.

15. The apparatus of claim 14, wherein said outer tube is generally U-shaped.

16. The apparatus of claim 12, wherein said filament comprises windings and said higher energy output portion has a higher winding density while said lower energy output portion has a lower winding density.

17. The apparatus of claim 8, wherein said at least one lamp further comprises a second higher energy output portion and said lower energy output portion is interposed between said higher energy output portion and said second higher energy output portion.

18. The apparatus of claim 8, wherein said first array comprises a number of lamps extending in a first direction and said second array comprises a number of lamps extending in a second direction that is generally normal to said first direction.

19. The apparatus of claim 18, wherein said first array comprises eleven lamps and said second array comprises eleven lamps.

20. The apparatus of claim 19, wherein said eleven lamps of said first array receive six different levels of input power across said eleven lamps of said first array.

21. The apparatus of claim 20, wherein said eleven lamps of said second array receive nine different levels of input power across said eleven lamps of said second array.

22. The apparatus of claim 8, wherein said at least one lamp comprises a filament having a varied winding density along its length.

23. The apparatus of claim 22, wherein said filament comprises a generally inactive portion that separates a first active portion and a second active portion.

24. The apparatus of claim 23, wherein said inactive portion extends along a length of between about 1/6 and about 1/3 of a total length of said filament when installed.

25. The apparatus of claim 23, wherein said at least one lamp has a length of about 16.5 inches and said inactive portion has a length of between about 3 and about 5 inches.

26. The apparatus of claim 23, wherein said inactive portion is generally centrally located along said at least one lamp.

27. A chemical vapor deposition apparatus, comprising a process chamber having an area for horizontal positioning of a substrate within a substrate treatment zone and having chamber walls for conducting a flow of gas across a surface of the substrate, a first bank of heat lamps that are disposed generally above said substrate treatment zone and a second bank of heat lamps that are disposed generally below said substrate treatment zone, said first bank having a length and a width with a first set of lamps each having a length that extends across said first bank width, said second bank having a length and a width with a second set of lamps each having a length that extends across said second bank width, said first bank width and said second bank width being disposed in generally parallel planes but extending in directions generally perpendicular to each other, at least one of said first bank and said second bank further comprising at least one lamp having means for adjusting lamp output across the corresponding one of said first bank width and said second bank width.

28. The apparatus of claim 27, wherein said means for adjusting comprises a nonlinear lamp.

29. The apparatus of claim 28, wherein said non-linear lamp comprises a generally U-shaped tube with a filament extending at least part way through said tube.

30. The apparatus of claim 29, wherein said filament extends completely through said tube and said filament has a varied winding density.

31. The apparatus of claim 27, wherein said means for adjusting comprises a pair of nonlinear lamps extending partially across said corresponding one of said first bank width and said second bank width, said non-linear lamps each comprising a bight and a pair of legs, said bights being disposed proximate each other and said pairs of legs extending away from each other.

32. The apparatus of claim 27, wherein said first bank and said second bank comprises a means for adjusting, said first bank means for adjusting comprising four nonlinear lamps and said second bank means for adjusting comprising four nonlinear lamps.

33. The apparatus of claim 32, wherein said first set of lamps comprises nine lamps in addition to said four nonlinear lamps in addition to said four nonlinear lamps of said first bank means for adjusting and said second set of lamps comprises nine lamps in addition to said four nonlinear lamps of said second bank means for adjusting.

34. The apparatus of claim 27, wherein said means for adjusting comprises at least one linear lamp having a varied output along its length.

35. The apparatus of claim 34, wherein said at least one linear lamp comprises an outer tube and a filament extending along at least a portion of the length of said tube.

36. The apparatus of claim 35, wherein said filament comprises a first active portion, a second active portion and an inactive portion, said inactive portion being disposed between said first active portion and said second active portion.

37. The apparatus of claim 36, wherein said first and second active portions have a higher winding density than said inactive portion.

38. The apparatus of claim 36, wherein said inactive portion is generally centrally located along a length of said at least one linear lamp.

39. The apparatus of claim 37, wherein said inactive portion comprises between about 1/3 and about 1/6 the entire length of said at least one linear lamp.

40. The apparatus of claim 37, wherein said first bank and said second bank comprises means for adjusting and said first bank means for adjusting comprises a first linear segmented lamp and said second bank means for adjusting comprises a second linear segmented lamp.

41. A method of configuring lamps, in a semiconductor processing chamber heated by an array of a plurality of lamps disposed proximate said chamber, said plurality of lamps comprising at least one linear lamp having a length, said length defining a width of said array, said method comprising identifying nonuniformities in the temperature of the substrate, replacing at least one of said plurality of lamps forming said array with a corrective lamp that allows for differential power output across a width of said array to compensate for said nonuniformity.

42. The method of claim 41, wherein said corrective lamp comprises a fixed ratio of power from a first region of said lamp to a second region of said lamp.

43. The method of claim 41, wherein said corrective lamp is nonlinear.

44. The method of claim 41, wherein said corrective lamp is segmented.

* * * * *